US010651016B2

(12) United States Patent
Huang et al.

(10) Patent No.: US 10,651,016 B2
(45) Date of Patent: May 12, 2020

(54) DETACHABLE GAS INJECTOR USED FOR SEMICONDUCTOR EQUIPMENT

(71) Applicant: HERMES-EPITEK CORPORATION, Taipei (TW)

(72) Inventors: Tsan-Hua Huang, Tainan (TW); Chia-Ying Lin, Yunlin County (TW)

(73) Assignee: Hermes-Epitek Corporation, Taipei (TW)

( * ) Notice: Subject to any disclaimer, the term of this patent is extended or adjusted under 35 U.S.C. 154(b) by 155 days.

(21) Appl. No.: 15/920,127

(22) Filed: Mar. 13, 2018

(65) Prior Publication Data

US 2018/0269036 A1 Sep. 20, 2018

(30) Foreign Application Priority Data

Mar. 15, 2017 (TW) .............................. 106108613 A

(51) Int. Cl.
*C23C 16/40* (2006.01)
*H01J 37/32* (2006.01)
*C23C 16/455* (2006.01)

(52) U.S. Cl.
CPC .... *H01J 37/3244* (2013.01); *C23C 16/45563* (2013.01); *C23C 16/45574* (2013.01); *C23C 16/45576* (2013.01)

(58) Field of Classification Search
CPC ........... H01J 37/3244; C23C 16/45576; C23C 16/45574; C23C 16/45563; C23C 16/455
USPC ........................ 118/715; 156/345.33, 345.34
See application file for complete search history.

(56) References Cited

U.S. PATENT DOCUMENTS

| | | | | |
|---|---|---|---|---|
| 5,453,124 A | * | 9/1995 | Moslehi | C23C 16/45561 118/715 |
| 5,532,190 A | * | 7/1996 | Goodyear | C23C 16/45512 118/715 |
| 5,846,883 A | * | 12/1998 | Moslehi | H01J 37/321 438/711 |
| 5,950,925 A | * | 9/1999 | Fukunaga | C23C 16/45512 239/132.3 |
| 6,245,192 B1 | * | 6/2001 | Dhindsa | C23C 16/455 156/345.34 |
| 6,302,965 B1 | * | 10/2001 | Umotoy | C23C 16/16 118/715 |
| 6,432,831 B2 | * | 8/2002 | Dhindsa | C23C 16/455 438/710 |

(Continued)

FOREIGN PATENT DOCUMENTS

JP 63079328 A * 4/1988
JP 2012038839 A * 2/2012

*Primary Examiner* — Rudy Zervigon
(74) *Attorney, Agent, or Firm* — Donald E. Stout; Stout, Uxa & Buyan, LLP

(57) ABSTRACT

A detachable gas injector adaptable to semiconductor equipment includes a top cover, a hollow sleeve, a top housing and a gas output unit. The hollow sleeve receives a convex part of the top cover, thus forming a first transmission passage between the hollow sleeve and the convex part. The top housing has a center hole for accommodating the hollow sleeve, thus forming a second transmission passage between the hollow sleeve and the center hole. The gas output unit is connected to a bottom surface of the hollow sleeve. The gas output unit includes a first partition plate and a second partition plate, which form a first gas output layer, a second gas output layer and a third gas output layer.

20 Claims, 8 Drawing Sheets

(56) References Cited

U.S. PATENT DOCUMENTS

| | | | | |
|---|---|---|---|---|
| 6,660,126 B2* | 12/2003 | Nguyen | C23C 16/4401 | 118/715 |
| 7,147,718 B2* | 12/2006 | Jurgensen | C23C 16/455 | 118/715 |
| 7,297,892 B2* | 11/2007 | Kelley | B08B 7/0035 | 219/121.36 |
| 7,591,957 B2* | 9/2009 | Carr | B23K 1/206 | 216/24 |
| 8,123,860 B2* | 2/2012 | Thakur | C23C 16/4412 | 118/715 |
| 8,291,857 B2* | 10/2012 | Lam | C23C 16/4412 | 118/723 ME |
| 8,293,015 B2* | 10/2012 | Lam | C23C 16/4412 | 118/715 |
| 8,317,968 B2* | 11/2012 | Dhindsa | H01J 37/32009 | 118/715 |
| 8,419,854 B2* | 4/2013 | Hatanaka | C23C 16/30 | 118/715 |
| 8,747,556 B2* | 6/2014 | Lam | C23C 16/4412 | 118/715 |
| 8,822,345 B2* | 9/2014 | Dhindsa | H01J 37/32009 | 216/58 |
| 8,828,182 B2* | 9/2014 | Detmar | H01J 37/321 | 156/345.1 |
| 8,846,539 B2* | 9/2014 | Dhindsa | H01J 37/32009 | 118/723 E |
| 9,240,307 B2* | 1/2016 | Amikura | H01J 37/3244 | |
| 9,574,268 B1* | 2/2017 | Dunn | C23C 16/45512 | |
| 9,855,575 B2* | 1/2018 | Huang | C23C 16/4401 | |
| 9,869,022 B2* | 1/2018 | Sawada | C23C 16/45565 | |
| 10,351,955 B2* | 7/2019 | Keshavamurthy | C23C 16/455 | |
| 10,403,474 B2* | 9/2019 | Phillips | C23C 16/45544 | |
| 10,407,771 B2* | 9/2019 | Cui | H01J 37/32522 | |
| 10,446,420 B2* | 10/2019 | Oki | C30B 25/14 | |
| 10,487,399 B2* | 11/2019 | Wu | C23C 16/45544 | |
| 10,504,754 B2* | 12/2019 | Tan | H01L 21/67069 | |
| 2003/0054099 A1* | 3/2003 | Jurgensen | C23C 14/0015 | 427/248.1 |
| 2003/0213560 A1* | 11/2003 | Wang | C23C 14/566 | 156/345.31 |
| 2005/0000441 A1* | 1/2005 | Kaeppeler | C23C 16/45568 | 118/723 E |
| 2005/0000656 A1* | 1/2005 | Carr | B23K 1/206 | 156/345.48 |
| 2005/0241765 A1* | 11/2005 | Dhindsa | H01J 37/32009 | 156/345.34 |
| 2005/0241766 A1* | 11/2005 | Dhindsa | H01J 37/32009 | 156/345.34 |
| 2005/0263248 A1* | 12/2005 | Rocha-Alvarez | C23C 16/4405 | 156/345.34 |
| 2006/0096540 A1* | 5/2006 | Choi | C23C 16/45574 | 118/724 |
| 2006/0130756 A1* | 6/2006 | Liang | C23C 16/45563 | 118/715 |
| 2006/0196420 A1* | 9/2006 | Ushakov | C23C 16/45563 | 118/715 |
| 2007/0095285 A1* | 5/2007 | Thakur | C23C 16/4412 | 118/715 |
| 2007/0187363 A1* | 8/2007 | Oka | H01J 37/3244 | 216/59 |
| 2010/0003406 A1* | 1/2010 | Lam | C23C 16/4412 | 427/255.391 |
| 2010/0151687 A1* | 6/2010 | Dhindsa | H01J 37/32009 | 438/710 |
| 2011/0198417 A1* | 8/2011 | Detmar | H01J 37/321 | 239/569 |
| 2013/0065396 A1* | 3/2013 | Dhindsa | H01J 37/32009 | 438/694 |
| 2014/0203702 A1* | 7/2014 | Amikura | H01J 37/3244 | 313/231.31 |
| 2014/0239091 A1* | 8/2014 | Huang | C23C 16/4401 | 239/128 |
| 2015/0167168 A1* | 6/2015 | Keshavamurthy | C23C 16/45565 | 438/758 |
| 2016/0035566 A1* | 2/2016 | LaVoie | C23C 16/45519 | 438/778 |
| 2016/0079036 A1* | 3/2016 | Kang | H01J 37/3244 | 156/345.34 |
| 2016/0244876 A1* | 8/2016 | Huang | C23C 16/4401 | |

* cited by examiner

100

144

144A

145

145A

DETACHABLE GAS INJECTOR USED FOR SEMICONDUCTOR EQUIPMENT

CROSS-REFERENCE TO RELATED APPLICATIONS

This application claims priority to Taiwan Patent Application No. 106108613, filed on Mar. 15, 2017, the entire contents of which are herein expressly incorporated by reference.

BACKGROUND OF THE INVENTION

1. Field of the Invention

The present invention generally relates to a detachable gas injector adaptable to semiconductor equipment, and more particularly to a detachable gas injector having gas output layers adaptable to a chemical vapor deposition (CVD) system.

2. Description of Related Art

The gas injector of conventional chemical vapor deposition (CVD) systems includes a connection channel constructed with connected plates having cavities. The diameter of the connection channel may be adjusted to regulate flow and uniformity.

The connected plates are commonly fixed by welding and thus cannot be detached for cleaning residues. Some composing parts cannot flexibly be replaced to regulate flow according to specific process requirements. Due to complexity of the connected plates and the connection channel, the conventional gas injector has high cost, and cleaning is time-consuming and laborious.

A need has thus arisen to propose a detachable gas injector that is capable of individually transferring reaction gases and being detached for cleaning or replacement.

SUMMARY OF THE INVENTION

In view of the foregoing, it is an object of the embodiment of the present invention to provide a detachable gas injector adaptable to chemical vapor deposition (CVD) system of semiconductor process that is capable of individually transferring reaction gases through layers such that the gasses can be evenly injected to a chamber, thus improving quality and yield of thin film deposition.

According to one embodiment, a detachable gas injector adaptable to semiconductor equipment includes a top cover, a hollow sleeve, a top housing and a gas output unit. The top cover has a first air intake passage, a second air intake passage and a third air intake passage for inputting a first reaction gas, a second reaction gas and a third reaction gas respectively, the top cover having a convex part disposed at bottom of the top cover, through which the third air intake passage passes. The hollow sleeve receives the convex part, a top surface of the hollow sleeve being connected to a bottom surface of the top cover, thus forming a first transmission passage between an inner side wall of the hollow sleeve and an outer side wall of the convex part, the first transmission passage communicating with the first air intake passage. The top housing has a center hole for accommodating the hollow sleeve, a cover surface of the top cover being disposed on a top surface of the top housing, thus forming a second transmission passage between an outer side wall of the hollow sleeve and an inner side wall of the center hole, the second transmission passage communicating with the second air intake passage. The gas output unit is connected to a bottom surface of the hollow sleeve, the gas output unit including a first partition plate and a second partition plate, which form a first gas output layer, a second gas output layer and a third gas output layer for outputting the second reaction gas, the first reaction gas and the third reaction gas respectively.

DETAILED DESCRIPTION OF THE INVENTION

Figure 1A:
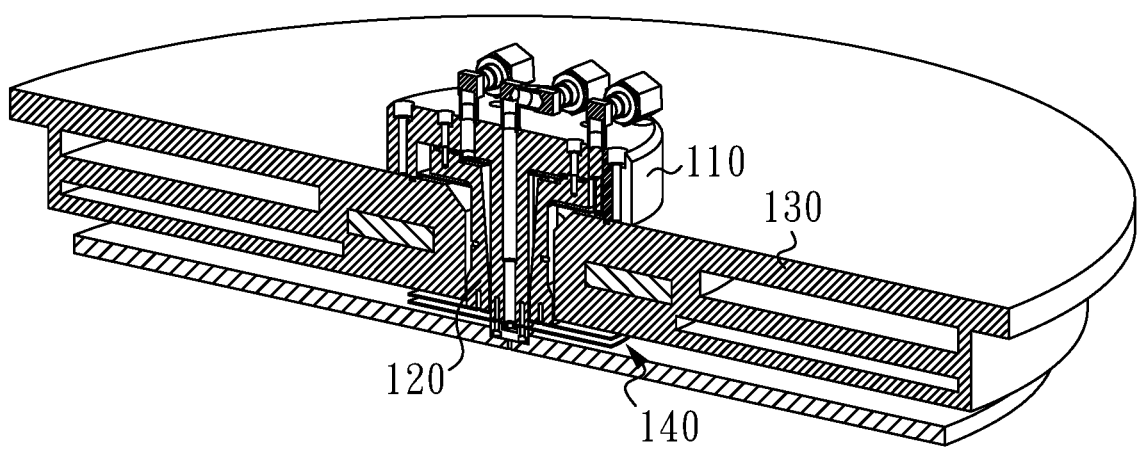
FIG. 1A shows a cross-sectional view illustrating a detachable gas injector adaptable to semiconductor equipment according to a first embodiment of the present invention.
Figure 1B:
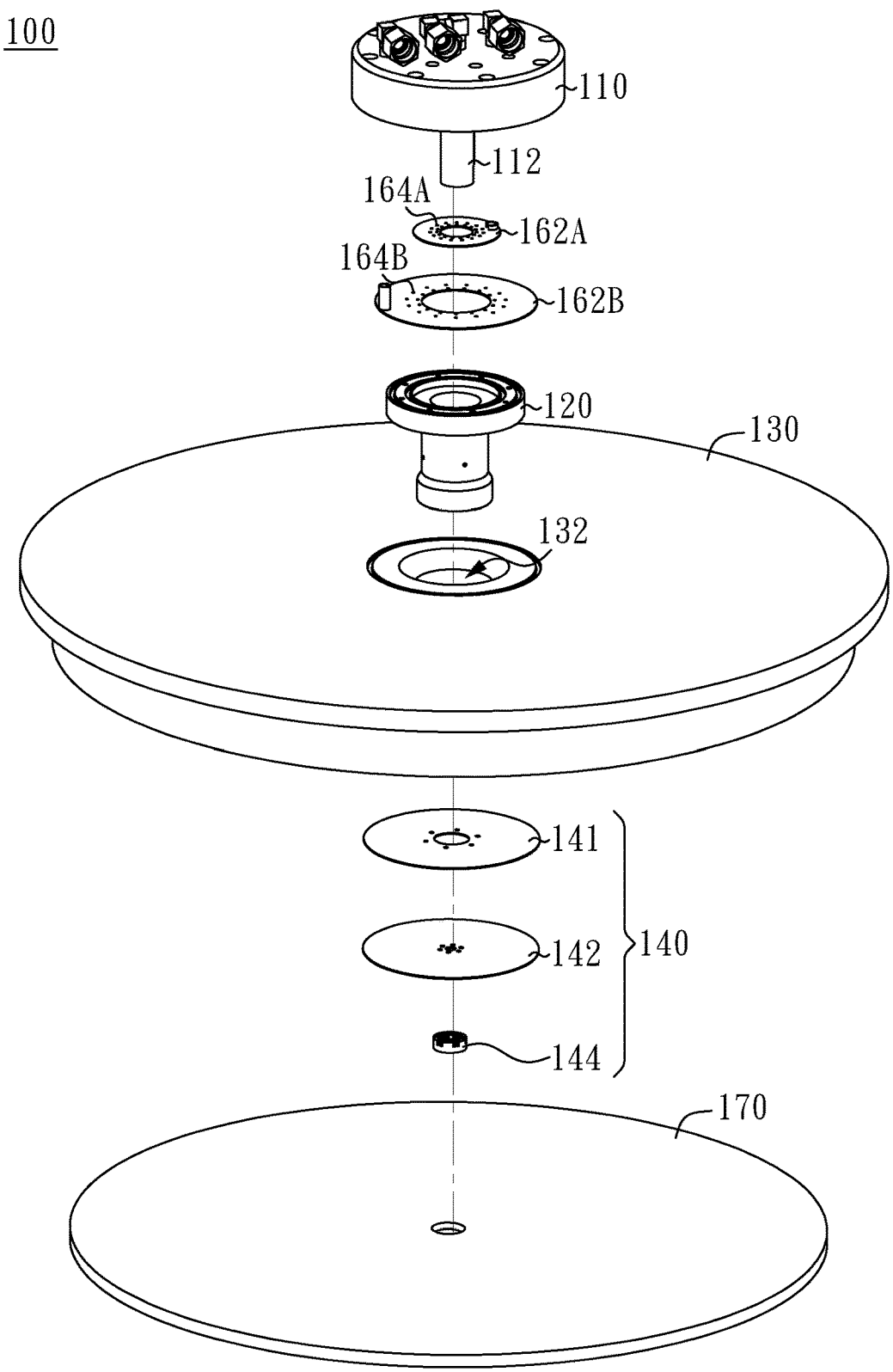
FIG. 1B shows an exploded view illustrating the detachable gas injector adaptable to semiconductor equipment according to the first embodiment of the present invention.
Figure 1C:
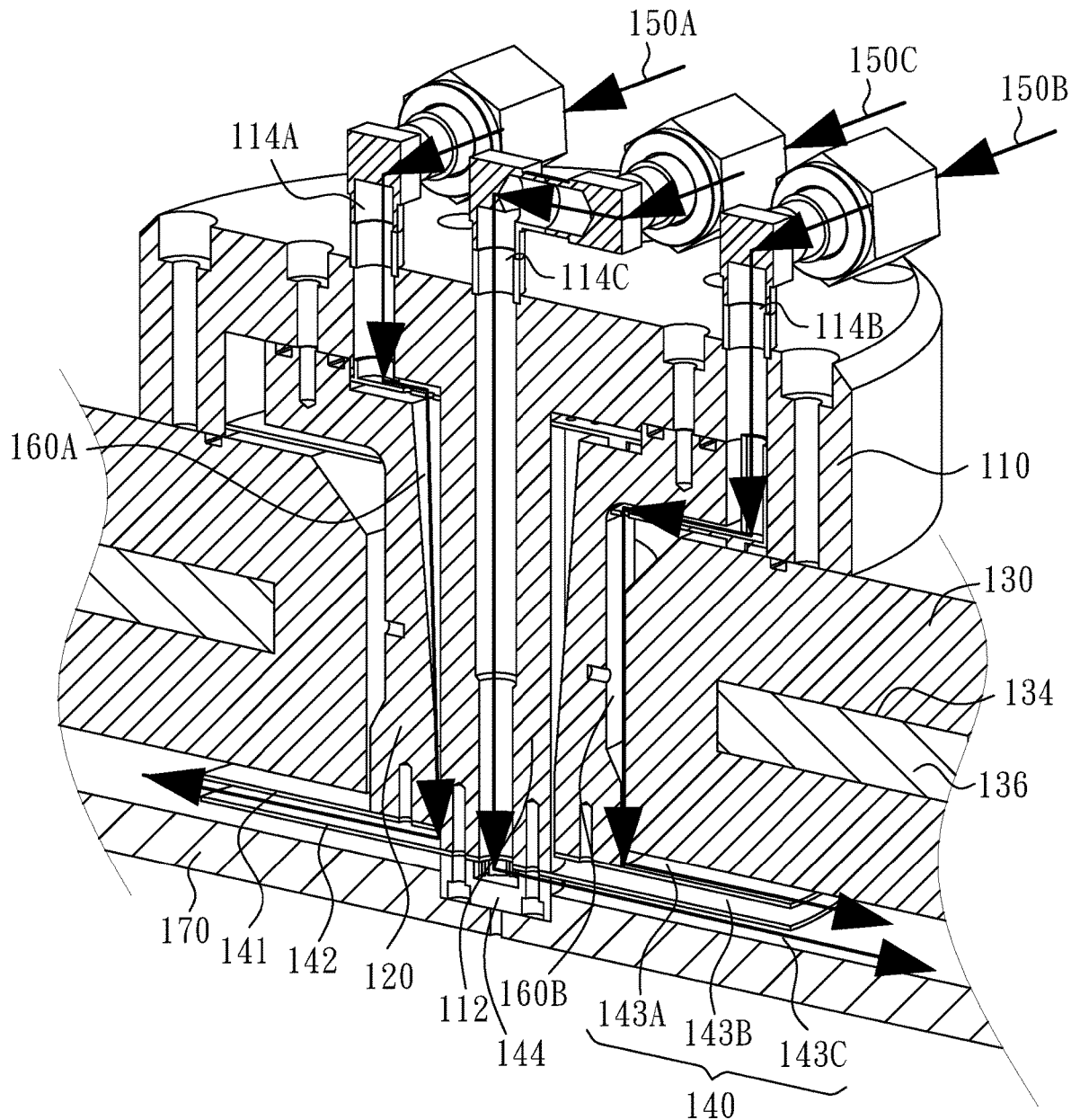
FIG. 1C shows a gas flow diagram illustrating the detachable gas injector adaptable to semiconductor equipment according to the first embodiment of the present invention.

FIG. 1A, FIG. 1B and FIG. 1C respectively show a cross-sectional view, an exploded view, and a gas flow diagram of a detachable gas injector 100 adaptable to semiconductor equipment according to a first embodiment of the present invention. The detachable gas injector 100 of the embodiment may include a top cover 110, a hollow sleeve 120, a top housing 130 and a gas output unit 140. The top cover 110 may include a first air intake passage 114A, a second air intake passage 114B and a third air intake passage 114C configured to input first reaction gas, second reaction gas and third reaction gas, respectively. The top cover 110 may also include a convex part 112 disposed at bottom of the top cover 110, through which the third air intake passage 114C passes. The hollow sleeve 120 receives the convex part 112. A top surface of the hollow sleeve 120 is connected to a bottom surface of the top cover 110, thus forming a first transmission passage 160A between an inner side wall of the hollow sleeve 120 and an outer side wall of the convex part 112, the first transmission passage 160A communicating with the first air intake passage 114A. The top housing 130 has a center hole 132 for accommodating the hollow sleeve 120. A cover surface of the top cover 110 is disposed on a top surface of the top housing 130, thus forming a second transmission passage 160B between an outer side wall of the hollow sleeve 120 and an inner side wall of the center hole 132, the second transmission passage 160B communicating with the second air intake passage 114B. The gas output unit 140 is connected to a bottom surface of the hollow sleeve 120. The gas output unit 140 may include a first partition plate 141 and a second partition plate 142, which form a first gas output layer 143A, a second gas output layer 143B and a third gas output layer 143C, from top to bottom, configured to output the second reaction gas 150B, the first reaction gas 150A and the third reaction gas 150C, respectively.

In the embodiment, the top cover 110, the hollow sleeve 120, the top housing 130 and the gas output unit 140 may be assembled to form the gas injector 100, and may be detached for replacement or cleaning. The top cover 110, the hollow sleeve 120, the top housing 130 and the gas output unit 140 may be fixed, for example, by fastening, plugging or other suitable methods.

A first flow guide plate 162A disposed across the first transmission passage 160A has evenly distributed first flow guide holes 164A configured to evenly diffuse the first reaction gas 150A (from the first air intake passage 114A) into the first transmission passage 160A. Similarly, a second flow guide plate 162B disposed across the second transmission passage 160B has evenly distributed second flow guide holes 164B configured to evenly diffuse the second reaction gas 150B (from the second air intake passage 114B) into the second transmission passage 160B.

In one embodiment, the top housing 130 may include a cooling unit 134 configured to circulate cooling liquid 136 around the center hole 132, thus providing a temperature control scheme for conditioning temperature of the top cover 110, the hollow sleeve 120 and the top housing 130.

As shown in FIG. 1C, the first partition plate 141 of the gas output unit 140 is connected to a bottom surface of the hollow sleeve 120, which is lower than a bottom surface of the top housing 130. The first gas output layer 143A is disposed between a top surface of the first partition plate 141 and a bottom surface of the top housing 130.

The second partition plate 142 is connected to a bottom surface of the convex part 112 of the top cover 110, which is lower than the bottom surface of the hollow sleeve 120. The second gas output layer 143B is disposed between a top surface of the second partition plate 142 and a bottom surface of the first partition plate 141.

Figure 1D:
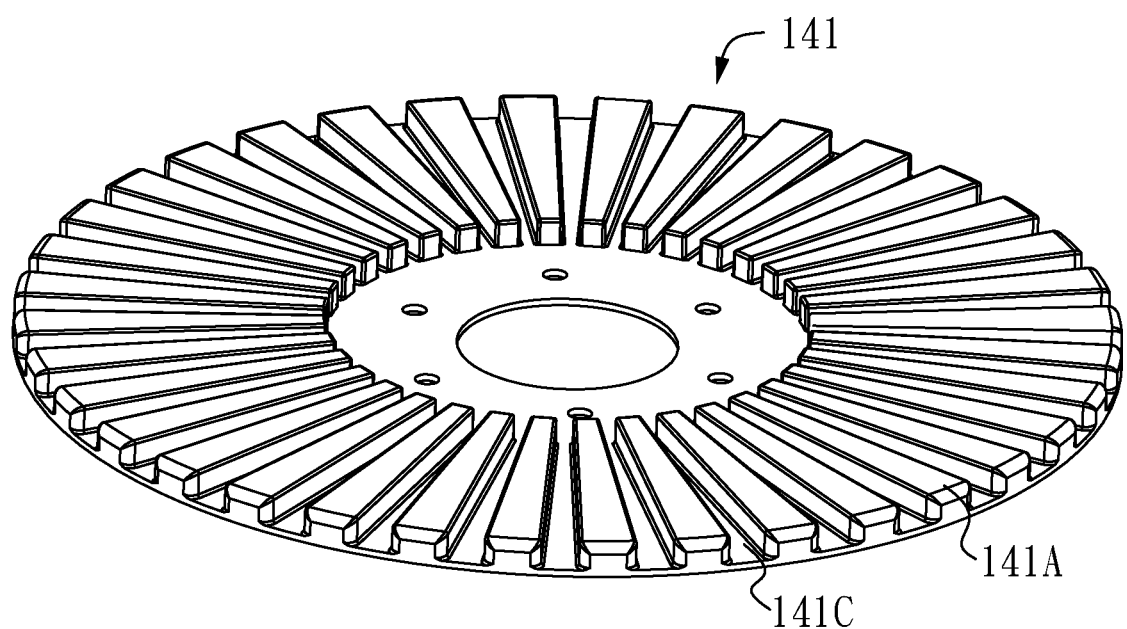
FIG. 1D shows a perspective view illustrating the first partition plate according to one embodiment of the present invention.

FIG. 1D shows a perspective view illustrating the first partition plate 141 according to one embodiment of the present invention. The first partition plate 141 may include flow guide blocks 141A radially and evenly disposed around a center area of the first partition plate 141, thus forming flow guide passages 141C for evenly injecting the second reaction gas 150B.

Figure 1E:
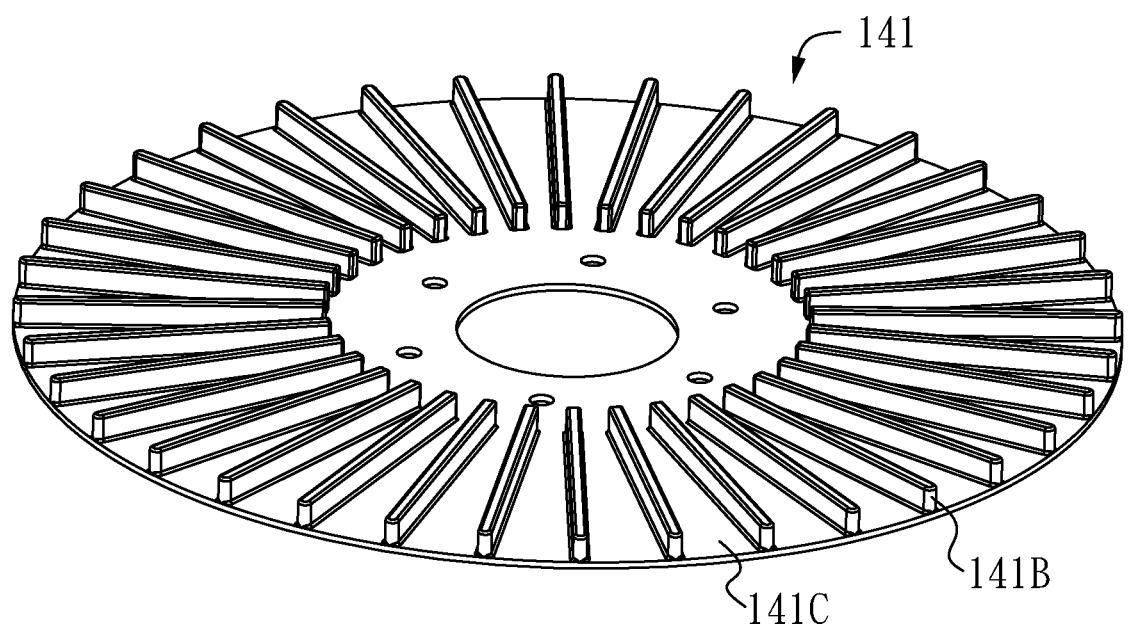
FIG. 1E shows a perspective view illustrating the first partition plate according to another embodiment of the present invention.

FIG. 1E shows a perspective view illustrating the first partition plate 141 according to another embodiment of the present invention. The first partition plate 141 may include flow guide plates 141B radially and evenly disposed around a center area of the first partition plate 141, thus forming flow guide passages 141C for evenly injecting the second reaction gas 150B. It is appreciated that the second partition plate 142 may be made similar to the first partition plate 141 as shown in FIG. 1D or FIG. 1E.

Referring back to FIG. 1B and FIG. 1C, the gas output unit 140 may further include a flow guide cover 144 disposed at an output of the third air intake passage 114C. A top surface of the flow guide cover 144 is connected to a bottom surface of the second partition plate 142 for guiding the third reaction gas 150C. Specifically, the flow guide cover 144 is embedded in a heat spreader. The third gas output layer 143C is disposed between a bottom surface of the second partition plate 142 and a top surface of the heat spreader 170.

In the embodiment, the first partition plate 141, the second partition plate 142 and the flow guide cover 144 may be assembled to form the gas output unit 140. The first partition plate 141, the second partition plate 142 and the flow guide cover 144 may be fixed, for example, by fastening, plugging or other suitable methods.

Figures 1F, 1G:
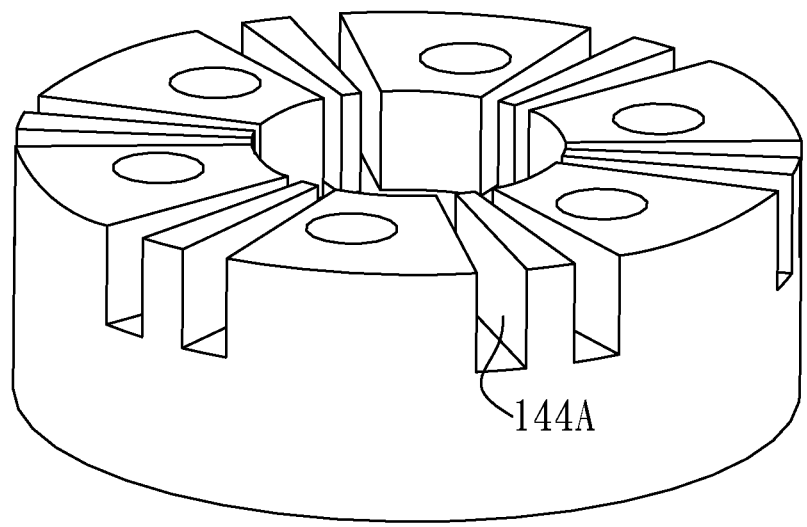
FIG. 1F shows a perspective view illustrating the flow guide cover according to one embodiment of the present invention.
FIG. 1G shows a perspective view illustrating a bolt according to one embodiment of the present invention.

FIG. 1F shows a perspective view illustrating the flow guide cover 144 according to one embodiment of the present invention. The flow guide cover 144 may have flow guide grooves 144A for evenly transferring the third reaction gas 150C to the third gas output layer 143C, and finally evenly be injected to a chamber.

FIG. 1G shows a perspective view illustrating a bolt 145 included in the gas output unit 140 and disposed at an output of the third air intake passage 114C according to one embodiment of the present invention. The bolt 145 has a through hole 145A for providing vacuum, thus preventing residual gas from entering into other passages. Accordingly, the bolt 145 and the flow guide cover 144 may be configured by a user according to different reaction gases.

Figure 2A:
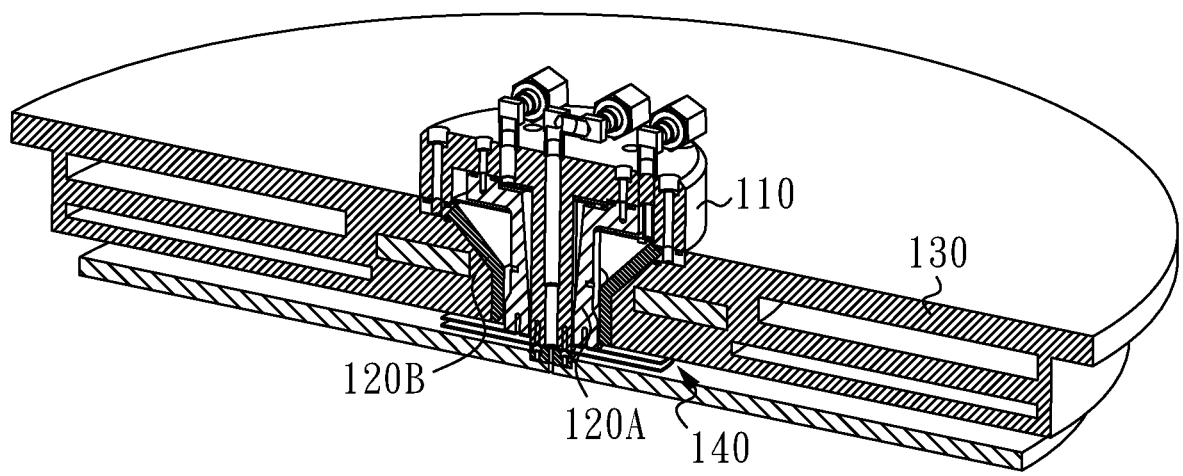
FIG. 2A shows a cross-sectional view illustrating a detachable gas injector adaptable to semiconductor equipment according to a second embodiment of the present invention.
Figure 2B:
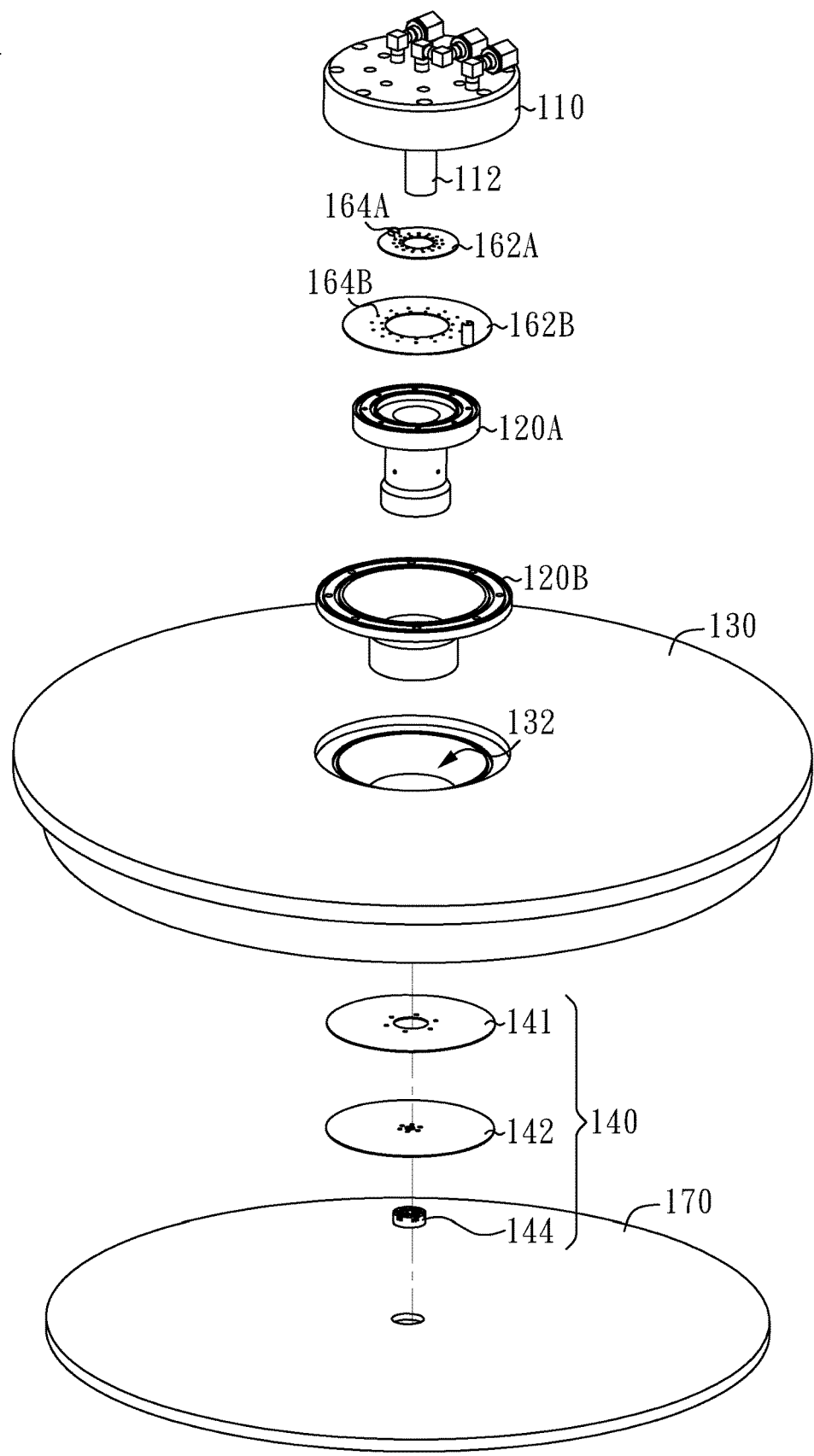
FIG. 2B shows an exploded view illustrating the detachable gas injector adaptable to semiconductor equipment according to the second embodiment of the present invention.
Figure 2C:
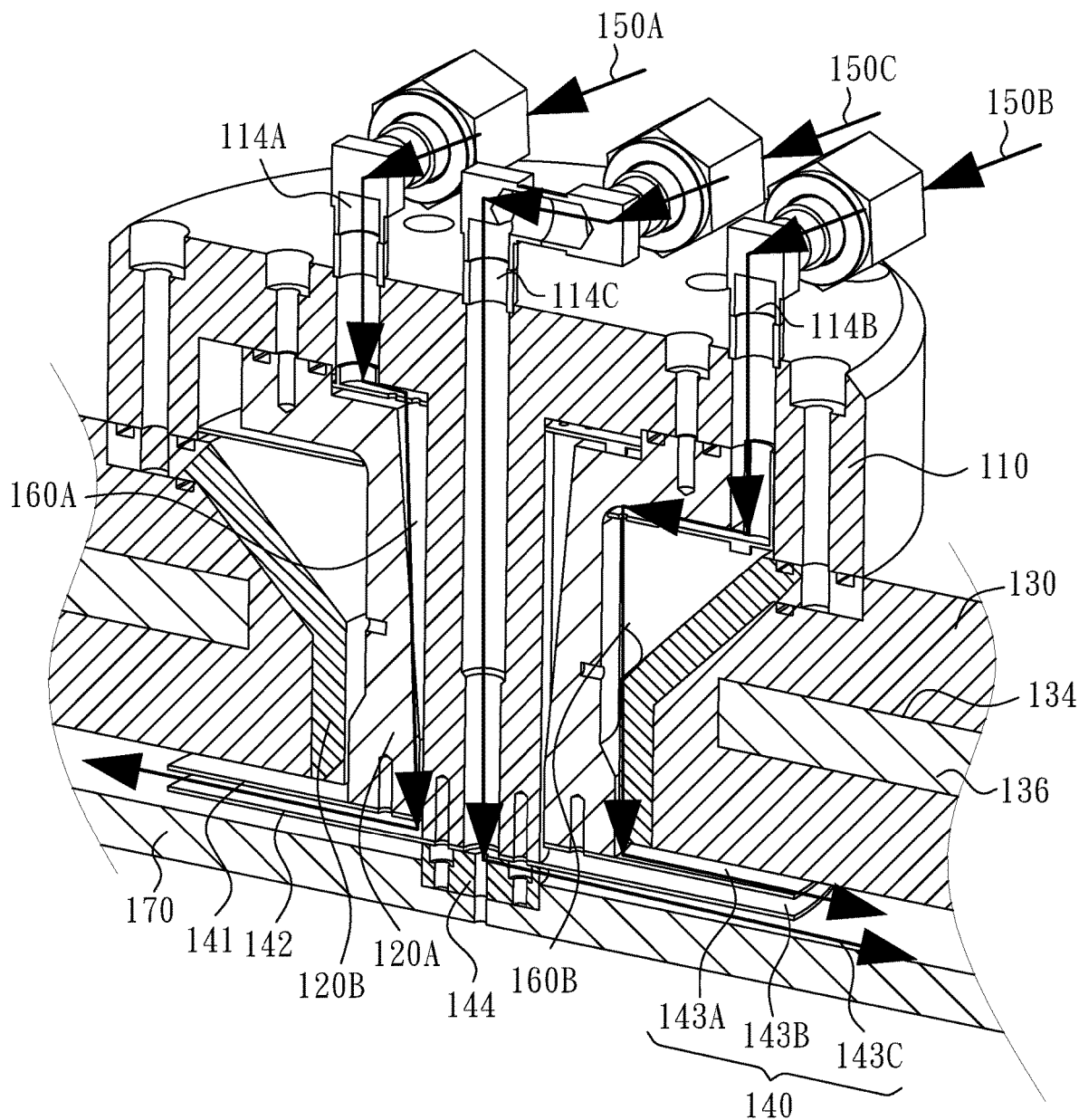
FIG. 2C shows a gas flow diagram illustrating the detachable gas injector adaptable to semiconductor equipment according to the second embodiment of the present invention.

FIG. 2A, FIG. 2B and FIG. 2C respectively show a cross-sectional view, an exploded view, and a gas flow diagram of a detachable gas injector 100 adaptable to semiconductor equipment according to a second embodiment of the present invention. The detachable gas injector 100 of the embodiment may include a top cover 110, a first hollow sleeve 120A, a second hollow sleeve 120B, a top housing 130 and a gas output unit 140. The top cover 110 may include a first air intake passage 114A, a second air intake passage 114B and a third air intake passage 114C configured to input first reaction gas, second reaction gas and third reaction gas, respectively. The top cover 110 may also include a convex part 112 disposed at bottom of the top cover 110, through which the third air intake passage 114C passes. The first hollow sleeve 120A receives the convex part 112. A top surface of the first hollow sleeve 120A is connected to a bottom surface of the top cover 110, thus forming a first transmission passage 160A between an inner side wall of the first hollow sleeve 120A and an outer side wall of the convex part 112, the first transmission passage 160A communicating with the first air intake passage 114A. The second hollow sleeve 120B receives the first hollow sleeve 120A. A top surface of the second hollow sleeve 112B is connected to a bottom surface of the top cover 110, thus forming a second transmission passage 160B between an inner side wall of the second hollow sleeve 120B and an outer side wall of the first hollow sleeve 120A, the second transmission passage 160B communicating with the second air intake passage 114B. The top housing 130 has a center hole 132 for accommodating the second hollow sleeve 120B. A cover surface of the top cover 110 is disposed on a top surface of the top housing 130. The gas output unit 140 is connected to bottom surfaces of the first hollow sleeve 120A and the second hollow sleeve 120B. The gas output unit 140 may include a first partition plate 141 and a second partition plate 142, which form a first gas output layer 143A, a second gas output layer 143B and a third gas output layer 143C, from top to bottom, configured to output the second reaction gas 150B, the first reaction gas 150A and the third reaction gas 150C, respectively.

Specifically, in the embodiment, the first partition plate 141 of the gas output unit 140 is connected to a bottom surface of the first hollow sleeve 120A, which is lower than a bottom surface of the top housing 130. The second hollow sleeve 120B and the top housing 130 have a common bottom surface. The first gas output layer 143A is disposed between a top surface of the first partition plate 141 and the common bottom surface of the second hollow sleeve 120B and the top housing 130.

The second partition plate 142 is connected to a bottom surface of the convex part 112 of the top cover 110, which is lower than a bottom surface of the first hollow sleeve 120A. The second gas output layer 143B is disposed between a top surface of the second partition plate 142 and a bottom surface of the first partition plate 141. Other aspects of the gas injector 100 of the embodiment are similar to the previous embodiment, and details of the present embodiment are thus omitted for brevity.

Although specific embodiments have been illustrated and described, it will be appreciated by those skilled in the art that various modifications may be made without departing from the scope of the present invention, which is intended to be limited solely by the appended claims.

What is claimed is:

1. A detachable gas injector adaptable to semiconductor equipment, comprising: a top cover having a first air intake passage, a second air intake passage and a third air intake passage for inputting a first reaction gas, a second reaction gas and a third reaction gas respectively, the top cover having a convex part disposed at the bottom of the top cover, through which the third air intake passage passes; a hollow sleeve that receives the convex part, a top surface of the hollow sleeve being connected to a bottom surface of the top cover, thus forming a first transmission passage between an inner side wall of the hollow sleeve and an outer side wall of the convex part, the first transmission passage communicating with the first air intake passage; a top housing having a center hole for accommodating the hollow sleeve, a cover surface of the top cover being disposed on a top surface of the top housing, thus forming a second transmission passage between an outer side wall of the hollow sleeve and an inner side wall of the center hole, the second transmission passage communicating with the second air intake passage; and a gas output unit connected to a bottom surface of the hollow sleeve, the gas output unit including a first partition plate and a second partition plate, which form a first gas output layer, a second gas output layer and a third gas output layer for outputting the second reaction gas, the first reaction gas and the third reaction gas respectively.

2. The detachable gas injector of claim 1, further comprising:
a first flow guide plate disposed across the first transmission passage and having evenly distributed first flow guide holes; and
a second flow guide plate disposed across the second transmission passage and having evenly distributed second flow guide holes.

3. The detachable gas injector of claim 1, wherein the top housing comprises a cooling unit that circulates cooling liquid around the center hole.

4. The detachable gas injector of claim 1, wherein the first partition plate is connected to the bottom surface of the hollow sleeve, which is lower than a bottom surface of the top housing, the first gas output layer being disposed between a top surface of the first partition plate and the bottom surface of the top housing.

5. The detachable gas injector of claim 1, wherein the second partition plate is connected to a bottom surface of the convex part of the top cover, which is lower than the bottom surface of the hollow sleeve, the second gas output layer being disposed between a top surface of the second partition plate and a bottom surface of the first partition plate.

6. The detachable gas injector of claim 1, wherein at least one of the first partition plate and the second partition plate has a plurality of flow guide blocks or flow guide plates radially disposed thereon, thus forming a plurality of flow guide passages.

7. The detachable gas injector of claim 1, wherein the gas output unit further comprises a flow guide cover disposed at an output of the third air intake passage, a top surface of the flow guide cover being connected to a bottom surface of the second partition plate for guiding the third reaction gas.

8. The detachable gas injector of claim 7, further comprising a heat spreader, in which the flow guide cover is embedded, the third gas output layer being disposed between a bottom surface of the second partition plate and a top surface of the heat spreader.

9. The detachable gas injector of claim 7, wherein the flow guide cover has a plurality of flow guide grooves for evenly transferring the third reaction gas to the third gas output layer.

10. The detachable gas injector of claim 1, wherein the gas output unit further comprises a bolt disposed at an output of the third air intake passage, the bolt having a through hole for providing vacuum for the third air intake passage.

11. A detachable gas injector adaptable to semiconductor equipment, comprising: a top cover having a first air intake passage, a second air intake passage and a third air intake passage for inputting a first reaction gas, a second reaction gas and a third reaction gas respectively, the top cover having a convex part disposed at the bottom of the top cover, through which the third air intake passage passes; a first hollow sleeve that receives the convex part, a top surface of the first hollow sleeve being connected to a bottom surface of the top cover, thus forming a first transmission passage between an inner side wall of the first hollow sleeve and an outer side wall of the convex part, the first transmission passage communicating with the first air intake passage; a second hollow sleeve that receives the first hollow sleeve, a top surface of the second hollow sleeve being connected to the bottom surface of the top cover, thus forming a second transmission passage between an inner side wall of the second hollow sleeve and an outer side wall of the first hollow sleeve, the second transmission passage communicating with the second air intake passage; atop housing having a centerhole for accommodating the second hollow sleeve, a cover surface of the top cover being disposed on a top surface of the top housing; and a gas output unit connected to bottom surfaces of the first hollow sleeve and the second hollow sleeve, the gas output unit including a first partition plate and a second partition plate, which form a first gas output layer, a second gas output layer and a third gas output layer for outputting the second reaction gas, the first reaction gas and the third reaction gas respectively.

12. The detachable gas injector of claim 11, further comprising:
a first flow guide plate disposed across the first transmission passage and having evenly distributed first flow guide holes; and
a second flow guide plate disposed across the second transmission passage and having evenly distributed second flow guide holes.

13. The detachable gas injector of claim 11, wherein the top housing comprises a cooling unit that circulates cooling liquid around the center hole.

14. The detachable gas injector of claim 11, wherein the first partition plate is connected to the bottom surface of the first hollow sleeve, which is lower than a bottom surface of the top housing, the first gas output layer being disposed between a top surface of the first partition plate and a common bottom surface of the second hollow sleeve and the top housing.

15. The detachable gas injector of claim 11, wherein the second partition plate is connected to a bottom surface of the convex part of the top cover, which is lower than the bottom surface of the first hollow sleeve, the second gas output layer being disposed between a top surface of the second partition plate and a bottom surface of the first partition plate.

16. The detachable gas injector of claim 11, wherein at least one of the first partition plate and the second partition plate has a plurality of flow guide blocks or flow guide plates radially disposed thereon, thus forming a plurality of flow guide passages.

17. The detachable gas injector of claim 11, wherein the gas output unit further comprises a flow guide cover disposed at an output of the third air intake passage, a top surface of the flow guide cover being connected to a bottom surface of the second partition plate for guiding the third reaction gas.

18. The detachable gas injector of claim 17, further comprising a heat spreader, in which the flow guide cover is embedded, the third gas output layer being disposed between a bottom surface of the second partition plate and a top surface of the heat spreader.

19. The detachable gas injector of claim 17, wherein the flow guide cover has a plurality of flow guide grooves for evenly transferring the third reaction gas to the third gas output layer.

20. The detachable gas injector of claim 11, wherein the gas output unit further comprises a bolt disposed at an output of the third air intake passage, the bolt having a through hole for providing vacuum for the third air intake passage.

* * * * *